(12) United States Patent
Andersson et al.

(10) Patent No.: US 8,665,000 B2
(45) Date of Patent: Mar. 4, 2014

(54) DOWN-CONVERSION USING SQUARE WAVE LOCAL OSCILLATOR SIGNALS

(75) Inventors: Stefan Andersson, Lund (SE); Fredrik Tillman, Lund (SE); Imad Ud Din, Lund (SE); Daniel Eckerbert, Lund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 40 days.

(21) Appl. No.: 13/576,827

(22) PCT Filed: Feb. 14, 2011

(86) PCT No.: PCT/EP2011/052106
§ 371 (c)(1),
(2), (4) Date: Aug. 30, 2012

(87) PCT Pub. No.: WO2011/101305
PCT Pub. Date: Aug. 25, 2011

(65) Prior Publication Data
US 2012/0313672 A1   Dec. 13, 2012

Related U.S. Application Data

(60) Provisional application No. 61/307,123, filed on Feb. 23, 2010.

(30) Foreign Application Priority Data

Feb. 19, 2010   (EP) .................................. 10154072

(51) Int. Cl.
*G06G 7/12*   (2006.01)

(52) U.S. Cl.
USPC .......................................... 327/355; 327/356

(58) Field of Classification Search
None
See application file for complete search history.

(56) References Cited

U.S. PATENT DOCUMENTS 7,133,656 B2 * 11/2006 Tanaka .......................... 455/310
7,509,110 B2    3/2009 Hayashi et al.
(Continued)

FOREIGN PATENT DOCUMENTS

WO   2008135954 A2   11/2008
WO   2009057051 A2    5/2009

OTHER PUBLICATIONS

Moseley, N. A. et al.; "A Two-Stage Approach to Harmonic Rejection Mixing Using Blind Interference Cancellation", IEEE Transactions on Circuits and Systems II: Express Briefs, IEEE, US LNKD-D01:10.1109/TCSII.2008.926796, vol. 55, No. 10, Oct. 1, 2008, pp. 966-970, XP011236580, ISSN: 1549-7747.

*Primary Examiner* — Tuan T Lam
(74) *Attorney, Agent, or Firm* — Coats and Bennett PLLC

(57) ABSTRACT

A method of frequency down-converting an input signal to an output signal, a first local oscillator signal is generated as a square wave having a duty cycle of 1/3 or 2/3, and the input signal is mixed with first oscillator signal to achieve a first down-converted signal, a second local oscillator signal is generated as a modified square wave having the same period time as the first oscillator signal and a duty cycle of 2/3, of which one part has a positive amplitude and another part has a negative amplitude. The input signal is mixed with the second oscillator signal to achieve a second down-converted signal. The first oscillator signal has a delay of 1/4 of the period time to achieve a phase shift of π/2 between the oscillator signals, and at least one down-converted signal is multiplied by a pre-calculated factor. The resulting down-converted signals are added to achieve the output signal.

8 Claims, 6 Drawing Sheets

(56) References Cited

U.S. PATENT DOCUMENTS 8,278,733 B2 * 10/2012 Yang et al. .................... 257/531
8,422,975 B2 * 4/2013 Behera et al. ................. 455/296
2010/0120377 A1 * 5/2010 He .................................. 455/77

* cited by examiner

DOWN-CONVERSION USING SQUARE WAVE LOCAL OSCILLATOR SIGNALS

TECHNICAL FIELD

Embodiments of the invention relates to a method and a mixing circuit for frequency down-converting an input signal having a first frequency to an output signal having a second frequency.

BACKGROUND

There is a fast development towards higher and higher data-rates in cellular communication systems. To achieve this, a number of different techniques are employed. One is to use higher order modulation, carrying more bits per second per Hertz of bandwidth. Another is to use multiple antennas (MIMO), transmitting and receiving multiple data-streams simultaneously at the same carrier frequency. The most important, however, is to use a wider bandwidth of the signal. There has been a dramatic increase of 100 times in bandwidth comparing Third Generation (3G) Long Term Evolution (3G LTE) (20 MHz) to Global System for Mobile Communication (GSM) (200 kHz). This, however, is not enough, and a next step will be to aggregate several LTE release 8 signals, to achieve a total bandwidth of up to 100 MHz for LTE release 10.

The problem of down-converting multiple component carriers can be solved in one of two ways: one direct-conversion receiver per component carrier or a heterodyne receiver with one IF to baseband conversion for each component carrier.

One direct-conversion receiver per component carrier is expensive in terms of both area and power consumption. From an implementation point of view, it is also very difficult to have several VCOs with frequencies close to each other operating simultaneously. This due to the interference and frequency pulling they are causing to each other.

A heterodyne receiver with one IF to baseband conversion per component carrier is subject to harmonic down-conversion unless the frequency translation is performed by an analog multiplier and the local oscillator (LO) is a pure sine wave. Since the IF LO most likely is available as a square wave, the odd harmonics will cause harmonic down-conversion.

To solve this problem, U.S. Pat. No. 7,509,110 suggests a mixer circuit that includes five component mixers connected in parallel. Each component mixer uses a phase-shifted version of the local oscillator signal for frequency translation to produce a component output signal from the input signal. The component output signals are scaled according to corresponding gain factors and combined to form the output signal. Thus this solution intends to resemble or imitate a sine/cosine waveform as an effective local oscillator signal to reduce the harmonic down-conversion, and to achieve this, a set of five mixers in parallel is required in order to reduce the impact of odd order harmonics within the first decade from the fundamental frequency.

Therefore, it is an object of embodiments of the invention to provide a method to avoid harmful harmonic down-conversion while still using an IF local oscillator with large harmonic content, such as a square wave local oscillator, and at the same time reducing the complexity of the mixing circuit.

SUMMARY

According to embodiments of the invention the object is achieved in a method of frequency down-converting an input signal having a first frequency to an output signal having a second frequency, comprising the steps of generating a first local oscillator signal as a square wave having a period time corresponding to the sum of or the difference between said first and second frequencies and a duty cycle of 1/3 or 2/3, the first local oscillator signal having the same polarity in the fraction of the period time where it is active. The method further comprises the steps of generating a second local oscillator signal as a modified square wave having the same period time as said first local oscillator signal and a duty cycle of 2/3, of which 1/3 of the period time has a positive amplitude and another 1/3 of the period time has a negative amplitude, said first and second local oscillator signals being generated with a phase shift of $\pi/2$ between them, such that said first local oscillator signal has a delay of 1/4 of said period time compared to said second local oscillator signal; mixing the input signal with the first local oscillator signal to achieve a first down-converted signal; mixing the input signal with the second local oscillator signal to achieve a second down-converted signal, multiplying at least one of said down-converted signals by a pre-calculated factor; and adding the two resulting down-converted signals to achieve said output signal.

By using the proposed method all odd harmonics up to and including the ninth order are suppressed. Third and ninth are suppressed by the chosen duty cycle of 1/3 or 2/3, while fifth and seventh are suppressed using the two mixers together with a gain stage such that the fundamental content is added in phase and the fifth and seventh order content is cancelled due to the 180 degree phase difference. This method utilizes a minimum of hardware to suppress all odd harmonics within a decade from the fundamental frequency. Thus the method creates reduced harmonic tones in a binary pulse-shaped signal. This is accomplished by combining pulse shaped signals of the same frequency, but with different mixing amplitudes and duty cycles in a specific phase alignment. The main advantage is the use of single frequency generation but reduced number of mixers needed in a practical implementation. This technique is based on frequency component cancellation with gain tuning.

In one embodiment the step of multiplying at least one of said down-converted signals by a pre-calculated factor comprises multiplying the first down-converted signal by a factor of $\sqrt{3}$.

Alternatively, the step of multiplying at least one of said down-converted signals by a pre-calculated factor comprises multiplying the second down-converted signal by a factor of $1/\sqrt{3}$.

The steps of generating the second local oscillator signal and mixing the input signal with the second local oscillator signal may be performed by generating two separate square wave signals having respectively a first and a second polarity and mixing the input signal with each one of the separate square wave signals.

Some embodiments of the invention also relates to a mixing circuit for frequency down-converting an input signal having a first frequency to an output signal having a second frequency, comprising an oscillator configured to generate a first local oscillator signal as a square wave having a period time corresponding to the sum of or the difference between said first and second frequencies and a duty cycle of 1/3 or 2/3, the first local oscillator signal having the same polarity in the fraction of the period time where it is active; and a first mixer configured to mix the input signal with the first local oscillator signal to achieve a first down-converted signal. The circuit further comprises an oscillator configured to generate a second local oscillator signal as a modified square wave having the same period time as said first local oscillator signal and a duty cycle of 2/3, of which 1/3 of the period time has a positive amplitude and another 1/3 of the period time has a negative amplitude, and the circuit being configured to generate said first and second local oscillator signals with a phase shift of π/2 between them (103), such that said first local oscillator signal has a delay of 1/4 of said period time compared to said second local oscillator signal; a second mixer configured to mix the input signal with the second local oscillator signal to achieve a second down-converted signal, an amplifier configured to multiply at least one of said down-converted signals by a pre-calculated factor; and an adder configured to add the two resulting down-converted signals to achieve said output signal.

Embodiments corresponding to those mentioned above for the method also apply for the mixing circuit.

BRIEF DESCRIPTION OF THE DRAWINGS

Embodiments of the invention will now be described more fully below with reference to the drawings, in which

FIG. 2 illustrates a square wave having a duty cycle a;

DETAILED DESCRIPTION OF EMBODIMENTS

Figure 1:
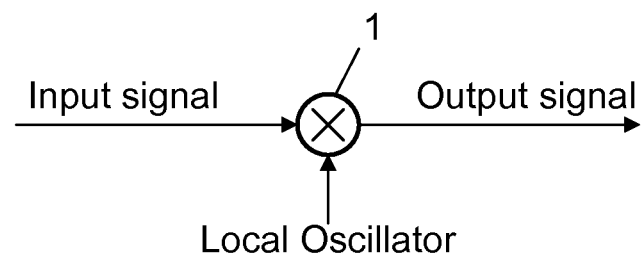
FIG. 1 shows the principle of a frequency mixer based on a multiplier circuit.

FIG. 1 shows the principle of a frequency mixer based on a multiplier circuit 1. Two signals of different or the same frequencies are applied to the multiplier circuit, i.e. an input signal and a local oscillator signal. At its output the mixer presents a mixture of signals having different frequencies, i.e. the sum of the frequencies of the input signal and the local oscillator signal and the difference between the frequencies of the input signal and the local oscillator signal. When the mixer is used in a receiver for down-conversion the input signal could be a received, modulated radio frequency signal or an intermediate frequency signal, which has already been down-converted once. In the down-conversion case the relevant output signal will be the signal having the difference frequency. In a transmitter the input signal could be a data signal to be modulated on the local oscillator signal to obtain a modulated radio frequency signal. In that case the relevant output signal will be the signal having the sum frequency.

In the following the down-conversion situation is considered, and thus the relevant output signal is the one for which the frequency is the difference between the frequencies of the input signal and the local oscillator signal. The sum frequency can be filtered out, and thus in the following equations only the difference frequency is considered. If both of these signals are pure sine waves the frequency translation is ideally performed by multiplying two signals:

$$\sin(\omega_{RF}t)\sin(\omega_{LO}t) = \frac{\cos((\omega_{RF}-\omega_{LO})t) - \cos((\omega_{RF}+\omega_{LO})t)}{2},$$

where $\omega_{RF}$ represents the frequency of the radio frequency input signal and $\omega_{LO}$ represents the frequency of the local oscillator signal.

An actual implementation would rather use a switching mixer which means that the LO signal is a square wave instead of a pure sine. The Fourier series of a square wave with 50% duty cycle is:

$$sq1x(\omega_{LO}t) = \frac{2}{\pi}\sum_{n=1,3,5,\ldots}\frac{\sin(n\omega_{LO}t)}{n} = \frac{2}{\pi}\left[\underbrace{\frac{\sin(\omega_{LO}t)}{1}}_{I} + \underbrace{\frac{\sin(3\omega_{LO}t)}{3} + \frac{\sin(5\omega_{LO}t)}{5} + \ldots}_{II}\right]$$

The desired frequency translation comes from part I of the equation while the unwanted harmonic down-conversion comes from part II.

When mixing the radio frequency input signal with the square wave instead of the pure sine wave, the expression for the generated output of the switching mixer would be:

$$\sin(\omega_{RF}t)sq1x(\omega_{LO}t) = \frac{2}{\pi}\left(\underbrace{\frac{\cos((\omega_{RF}-\omega_{LO})t) - \cos((\omega_{RF}+\omega_{LO})t)}{2}}_{I} ++ \right.$$

$$\left.\underbrace{\frac{\frac{\cos((\omega_{RF}-3\omega_{LO})t)-\cos((\omega_{RF}+3\omega_{LO})t)}{6} + \frac{\cos((\omega_{RF}-5\omega_{LO})t)-\cos((\omega_{RF}+5\omega_{LO})t)}{10} + \ldots}{}}_{II}\right)$$

We would like to preserve part I of the equation while minimizing part II, which represents the unwanted harmonic down-conversion.

Figure 2:
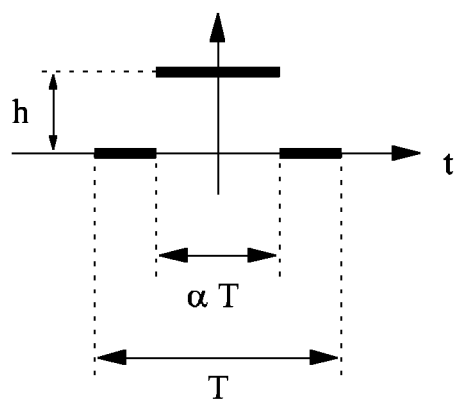

One way to reduce part II can be to adjust the duty cycle of the square wave. The duty cycle of the square wave signal is defined as the fraction of the period time where the signal is active, i.e. different from zero. As shown below, this can cancel or reduce some of the harmonics. FIG. 2 illustrates a square wave having a period time T and a duty cycle α. By changing the duty cycle of the square wave it is possible to cancel e.g. either the third or fifth order harmonic distortion according to the general Fourier expansion according to:

$$f(t) = \frac{1}{2}a_0 + \sum_{n=1}^{\infty} a_n \cos(n\Omega t), \, \Omega = 2\pi/T$$

$$a_0 = 2\alpha h$$

$$a_n = \frac{2h\sin(n\pi\alpha)}{n\pi}, \, n \geq 1,$$

where n is the order of the harmonic and $a_n$ is the corresponding amplitude.

Figure 3:
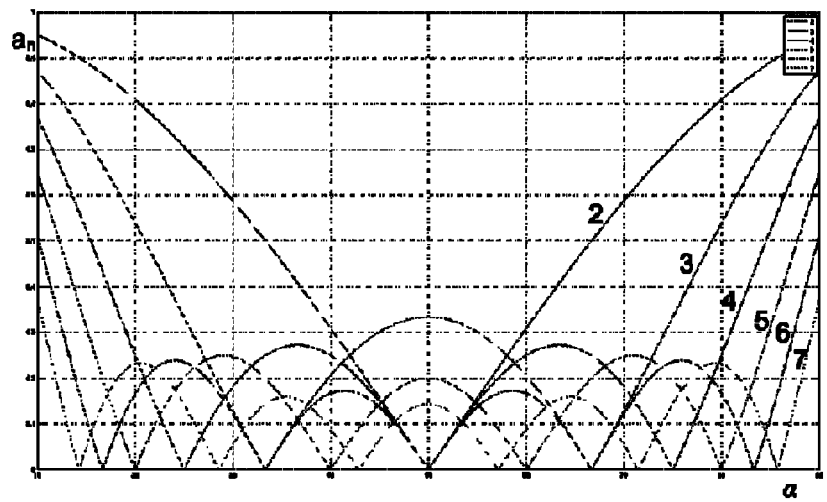
FIG. 3 shows the effect of changing the duty cycle a to manipulate the amplitude of the harmonic tones.

The effect of changing the duty cycle α to manipulate the amplitude of the harmonic tones is shown in FIG. 3, where the values of the coefficients $a_n$ are plotted versus the duty cycle of the square wave. For instance, it can be seen that α equal to 1/3 or 2/3 of the period time will completely remove the $3^{rd}$ harmonic tone, as well as the $6^{th}$ and $9^{th}$ harmonic etc. Correspondingly, an α of 1/5, 2/5, 3/5, or 4/5 removes the $5^{th}$ and $10^{th}$ harmonic etc.

As can be seen, using a duty-cycle of 1/3 gives no harmonic down-conversion due to $3^{rd}$-order harmonic from the square wave LO. It is also clear that the duty-cycle can be adjusted to remove any harmonic in the Fourier series.

This idea is mainly intended for IF mixers. Therefore, an over-sampled LO signal can be used to accurately generate a waveform with desired duty cycle. The accuracy in duty cycle is expected to be better than using other methods based on matching of components and/or voltage levels. Being able to use switched mixer solutions and integer ratios of components that need to be matched is a great advantage.

However, the problem is that this approach only removes a single harmonic (and its multiples) and usually more than one harmonic cause problems. Thus, if e.g. the $3^{rd}$ harmonic is removed by using a duty cycle of 1/3 or 2/3, the $5^{th}$ and $7^{th}$ harmonics will still be present. Note that all even order tones are assumed to be small in a real implementation thanks to differential structures.

This problem can be solved as described below. The idea is to add a second waveform in parallel with a duty-cycle enhanced square wave, e.g. $\alpha=1/3$ in order to deal with the $5^{th}$ and $7^{th}$ harmonics. This is illustrated with the mixing circuit 3 in FIG. 4. The radio frequency input signal is fed to the two multipliers 4, 5, where it is mixed with the two different local oscillator signals LO1 and LO2, respectively. LO1 is the square wave with $\alpha=1/3$ described above, while LO2 is a different waveform that will be described below.

Figure 4:
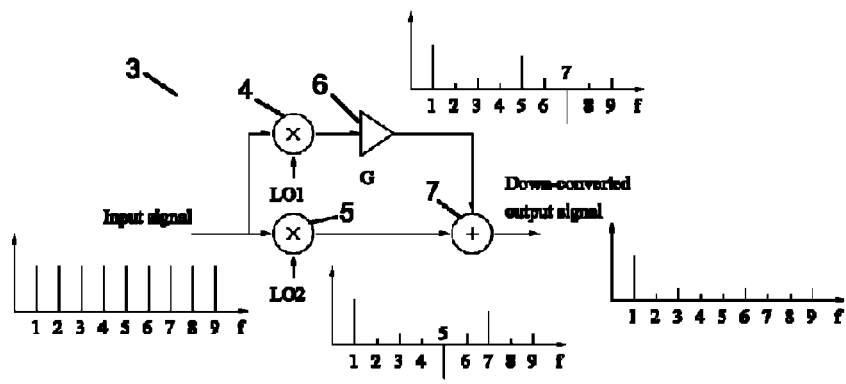
FIG. 4 shows a mixing circuit with two mixers in parallel.
Figure 5:
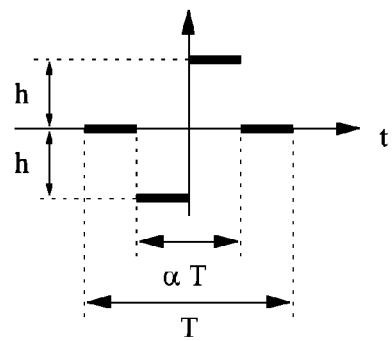
FIG. 5 shows a modified square wave to be used as a second local oscillator signal.

One example of such a waveform is illustrated in FIG. 5. This waveform is a modified square wave in which the duty cycle is divided into a first part having a negative amplitude and a second part having a positive amplitude. Again the duty cycle of this signal is the fraction of time where the signal is active, i.e. different from zero. The total duty cycle is 2/3, which ensures that also in this branch the $3^{rd}$ harmonic will be cancelled as described above. It will be shown below that the $5^{th}$ and $7^{th}$ harmonics of this signal will have opposite phase compared to the corresponding harmonics of the square wave. Thus when adding the mixing products from the two multipliers 4, 5 in an adder 7 as shown in FIG. 4 they will counteract each other.

Figure 6:
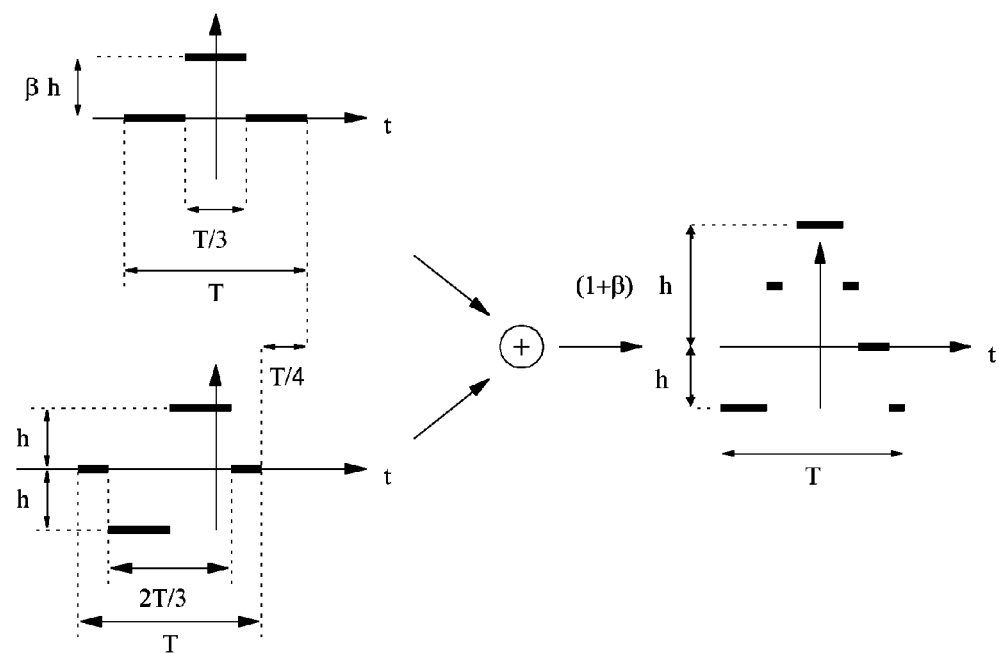
FIG. 6 illustrates how the waveforms are combined.

The Fourier expansion for this waveform is $$f(t) = \sum_{n=1}^{\infty} b_n \sin(n\Omega t), \ \Omega = 2\pi/T$$

$$b_n = \frac{2h(1 - \cos(n\pi\alpha))}{n\pi}$$

where again n is the order of the harmonic and $b_n$ is the corresponding amplitude. However, in order to make the fundamentals add up in phase the waveform must be phase shifted by $-\pi/2$, e.g. 1/4 of the period time T, which is illustrated in FIG. 6. In other words, the square wave, i.e. LO1, is delayed with T/4 compared to the other waveform LO2, which means that the mixing product for the square wave at time t should be added to the mixing product for the other waveform at time t+T/4. The same result can of course be achieved if the LO2 signal is delayed 3T/4 compared to the LO1 signal. Therefore, the Fourier expansion for this waveform is instead written as $$f(t) = \sum_{n=1}^{\infty} b_n \sin\left(n\Omega\left(t + \frac{T}{4}\right)\right)$$

-continued $$= \sum_{n=1}^{\infty} b_n \left[\sin(n\Omega t)\cos\left(\frac{n\Omega t}{4}\right) + \cos(n\Omega t)\sin\left(\frac{n\Omega t}{4}\right)\right]$$

Since $\Omega = 2\pi/T$, we get $$f(t) = \sum_{n=1}^{\infty} b_n \left[\sin(n\Omega t)\cos\left(\frac{n\pi}{2}\right) + \cos(n\Omega t)\sin\left(\frac{n\pi}{2}\right)\right]$$

For the odd harmonics, i.e. odd values of n, the first term will be zero, and thus the expression is reduced to $$f(t) = \sum_{n=1}^{\infty} b_n \cos(n\Omega t)\sin\left(\frac{n\pi}{2}\right) = \sum_{n=1}^{\infty} b_n \sin\left(\frac{n\pi}{2}\right)\cos(n\Omega t)$$

In other words, the amplitude of the odd harmonics of the LO2 signal can be written as $$b_n \sin\left(\frac{n\pi}{2}\right) = \frac{2h(1 - \cos(n\pi\alpha))}{n\pi}\sin\left(\frac{n\pi}{2}\right) = \frac{2h}{n\pi}(1 - \cos(n\pi\alpha))\sin\left(\frac{n\pi}{2}\right)$$

Thus for the $1^{st}$ (fundamental), $3^{rd}$, $5^{th}$ and $7^{th}$ harmonics of the LO2 signal with $\alpha=2/3$ the amplitude will be $$n = 1: \frac{2h}{\pi}\left(1 - \cos\left(\frac{2\pi}{3}\right)\right)\sin\left(\frac{\pi}{2}\right) = \frac{2h}{\pi}\left(1 - \left(-\frac{1}{2}\right)\right)(1) = \frac{2h}{\pi}\frac{3}{2} = \frac{3h}{\pi}$$

$$n = 3: \frac{2h}{3\pi}\left(1 - \cos\left(3\pi\frac{2}{3}\right)\right)\sin\left(\frac{3\pi}{2}\right) = \frac{2h}{3\pi}(1 - (1))(-1) = 0$$

$$n = 5: \frac{2h}{5\pi}\left(1 - \cos\left(5\pi\frac{2}{3}\right)\right)\sin\left(\frac{5\pi}{2}\right) = \frac{2h}{5\pi}\left(1 - \left(-\frac{1}{2}\right)\right)(1) = \frac{2h}{5\pi}\frac{3}{2} = \frac{3h}{5\pi}$$

$$n = 7: \frac{2h}{7\pi}\left(1 - \cos\left(7\pi\frac{2}{3}\right)\right)\sin\left(\frac{7\pi}{2}\right) = \frac{2h}{7\pi}\left(1 - \left(-\frac{1}{2}\right)\right)(-1) = \frac{2h}{7\pi}\frac{3}{2}(-1) = -\frac{3h}{7\pi}$$

Correspondingly, for the $1^{st}$ (fundamental), $3^{rd}$, $5^{th}$ and $7^{th}$ harmonics of the LO1 signal, i.e. the square wave with $\alpha=1/3$ the amplitude will be $$n = 1: \frac{2h}{\pi}\sin\left(\frac{\pi}{3}\right) = \frac{2h}{\pi}\frac{\sqrt{3}}{2} = \frac{\sqrt{3}\,h}{\pi}$$

$$n = 3: \frac{2h}{3\pi}\sin\left(\frac{3\pi}{3}\right) = \frac{2h}{3\pi}0 = 0$$

$$n = 5: \frac{2h}{5\pi}\sin\left(\frac{5\pi}{3}\right) = \frac{2h}{5\pi}\left(-\frac{\sqrt{3}}{2}\right) = -\frac{\sqrt{3}\,h}{5\pi}$$

$$n = 7: \frac{2h}{7\pi}\sin\left(\frac{7\pi}{3}\right) = \frac{2h}{7\pi}\frac{\sqrt{3}}{2} = \frac{\sqrt{3}\,h}{7\pi}$$

From these values it can be seen that if the mixing products from the two multipliers 4, 5 are added together, the result will be that The fundamentals are added in phase. This is ensured by the phase shift of 1/4 of the period time mentioned above.

The $3^{rd}$ harmonic will be insignificant due to the selection of the duty cycles to be 1/3 and 2/3, respectively. This is also the case for the $6^{th}$, $9^{th}$ etc. harmonics.

The 5$^{th}$ and 7$^{th}$ harmonics of the two signals have opposite phases, and thus when the mixing products are added together in the adder 7 of FIG. 4 they will counteract each other. It is further seen that if the mixing product from the multiplier 4, i.e. from the square wave LO1, is multiplied by a scaling factor $\beta=\sqrt{3}$ before the mixing products are added, a complete 5$^{th}$ and 7$^{th}$ order cancellation will be possible. This is done with the amplifier 6 in FIG. 4. It is important to note that both 5$^{th}$ and 7$^{th}$ order harmonics experience total cancellation for the same value of $\beta$.

It is noted that the two local oscillator signals LO1 and LO2 are not necessarily generated by separate oscillators. It is possible to use the same oscillator for generating both LO1 and LO2. This can be done e.g. by using an over-sampled LO to generate the waveforms and create the phase shift.

FIG. 6 illustrates how the signals are combined. The left side of the figure shows the local oscillator signal LO2 and the local oscillator signal LO1 multiplied by $\beta$. The signal shown at the right side of the figure is these two local oscillator signals added to each other. However, it is noted that this signal does not exist as a physical signal, since it is the two down-converted signals that are added, not the two local oscillator signals. Instead, this signal just illustrates that the resulting down-converted signal will be as if it had been down-converted with a local oscillator signal having this shape. It is noted that the generated waveform does not try to imitate the sine/cosine waveforms usually generated by prior art.

In FIG. 4 the amplifier 6 providing the scaling factor $\beta=\sqrt{3}$ is applied to the mixing output from the multiplier 4. However, the same effect can be achieved by applying a scaling factor $\beta=1/\sqrt{3}$ to the mixing output from the multiplier 5, since it is the relative gain between the two mixing outputs that is important. It is also noted that the amplifier could also be arranged at the input signal to one of the multipliers.

Another variation is to invert both local oscillator signals, i.e. to multiply them by −1. In that case the square wave LO1 will have negative amplitude and still a duty cycle of 1/3, and for the LO2 signal the first part of the duty cycle will be positive and the second part negative.

Figure 7:
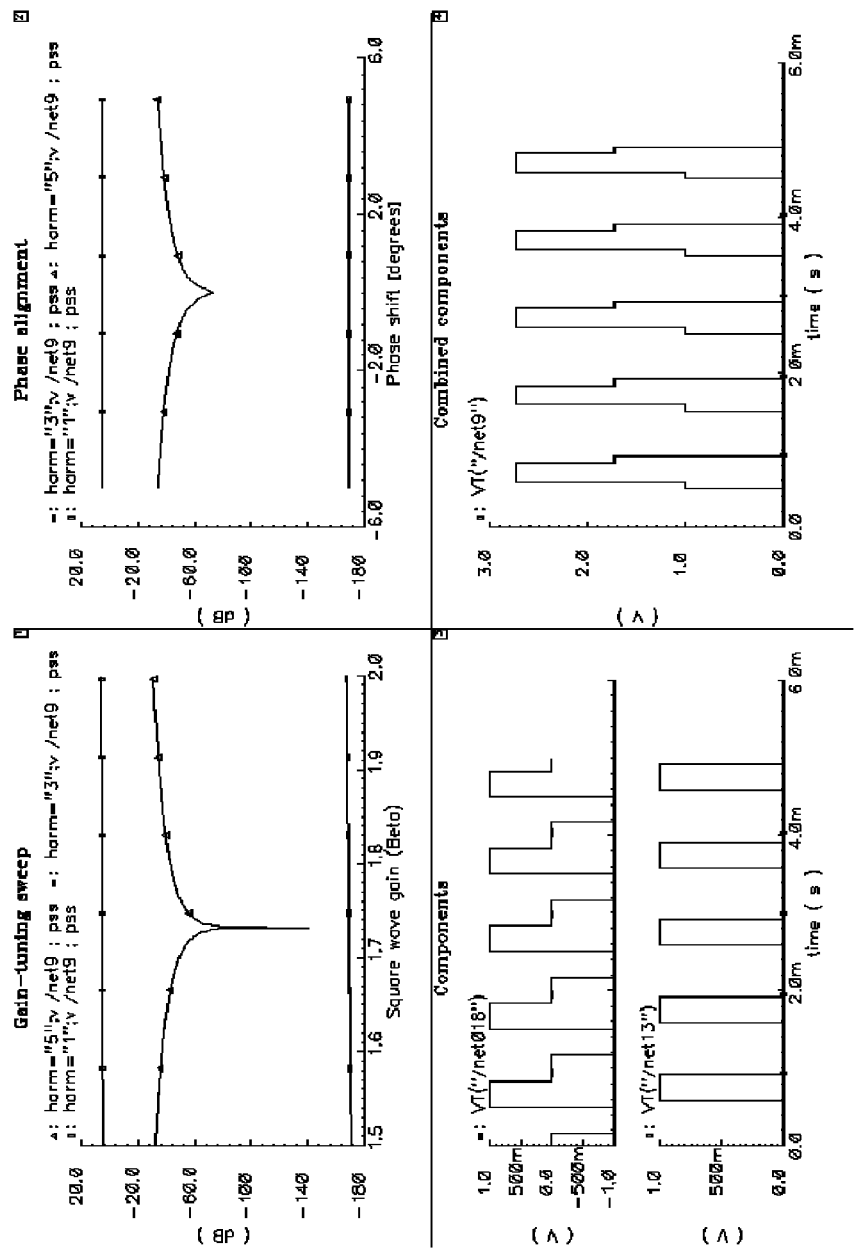
FIG. 7 illustrates the effect of the invention.

From the above equations it is seen that the optimal effect of cancelling the harmonics is achieved when the duty cycle $\alpha=1/3$ or 2/3, the scaling factor $\beta=\sqrt{3}$ or $1/\sqrt{3}$ and the phase shift is 1/4 of the period time. As mentioned above, the suppression of the 3$^{rd}$ harmonic is governed by the duty cycle, while the suppression of the 5$^{th}$ and 7$^{th}$ harmonics are governed by the amplitude tuning and the phase alignment between the two waveforms. In a practical implementation it might not be possible to achieve exactly these values, and therefore certain tolerances can be accepted. However, of course the best results are achieved with values as close as possible to the specified values. This is illustrated in FIG. 7 showing at the top the level of the 1$^{st}$, 3$^{rd}$ and 5$^{th}$ harmonics as a function of the gain tuning and the phase alignment, respectively. It is seen that the 1$^{st}$ harmonic is at a high level and the 3$^{rd}$ harmonic at a very low level independently of the gain as well as the phase alignment, while the 5$^{th}$ harmonic is suppressed when the scaling factor $\beta=\sqrt{3}$ and the phase alignment is $\pi/2$, respectively. It is also seen that a tolerance of e.g. ±5% on the gain factor still gives a relatively good suppression of the 5$^{th}$ harmonic. Similarly, a tolerance of ±2.5 degrees on the phase alignment gives a relatively good suppression of the 5$^{th}$ harmonic.

Figure 8:
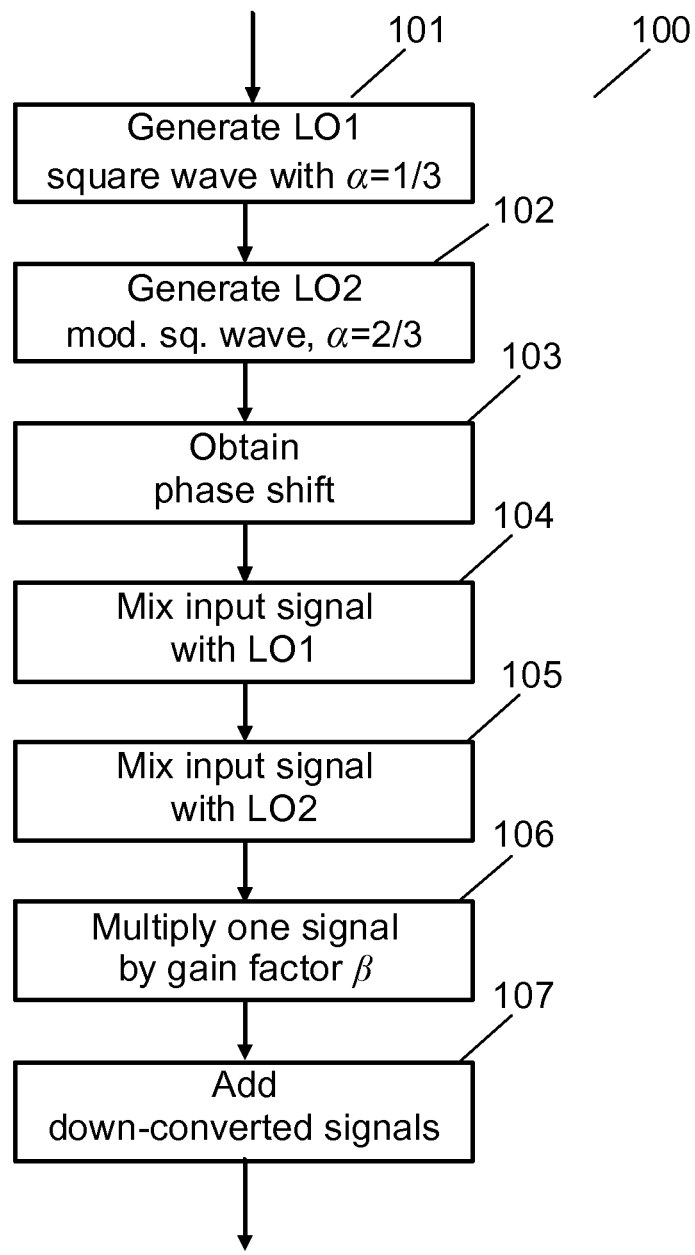
FIG. 8 shows a flowchart illustrating the method.

FIG. 8 shows a flow chart 100 illustrating the process described above. In step 101 the first local oscillator signal LO1 is generated as a square wave with a duty cycle $\alpha=1/3$. Alternatively, as mentioned above the duty cycle may be $\alpha=2/3$. In step 102 the second local oscillator signal LO2 is generated as a modified square wave with a duty cycle $\alpha=2/3$, of which one part has a positive amplitude and another part has a negative amplitude. In step 103 the first local oscillator signal LO1 is delayed by 1/4 of the period time to achieve a phase shift of $\pi/2$ between the two local oscillator signals. In a practical implementation the two local oscillator signals may just be generated with the appropriate phase shift. The LO1 signal is then used in step 104 for mixing the input signal in the multiplier 4 to obtain a first down-converted signal. The LO2 signal is used in step 105 for mixing the input signal in the multiplier 5 to obtain a second down-converted signal. In step 106 one of the down-converted signals is then multiplied by a pre-calculated factor, e.g. the gain factor $\beta$ described above, to ensure that the 5$^{th}$ and 7$^{th}$ harmonics are cancelled. Finally, in step 107 the two down-converted signals are added together to achieve the desired output signal.

Figure 9:
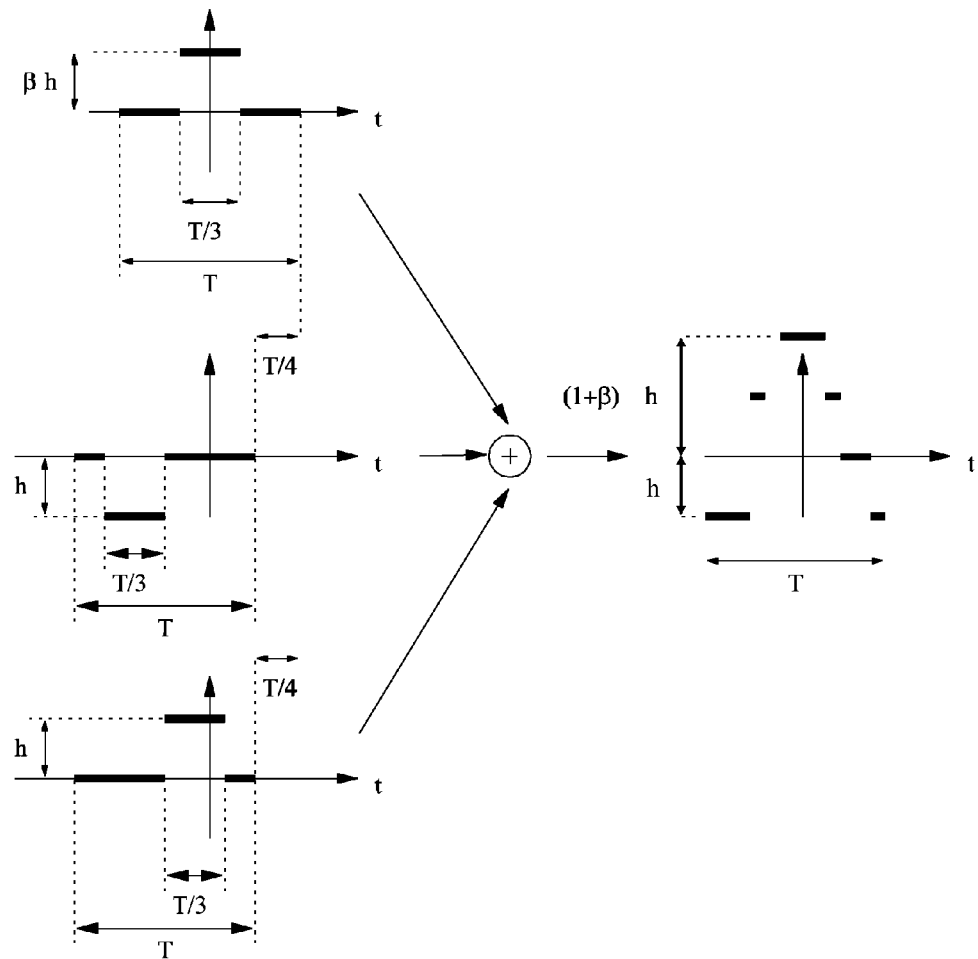
FIG. 9 shows the combination of three square wave local oscillator signals.
Figure 10:
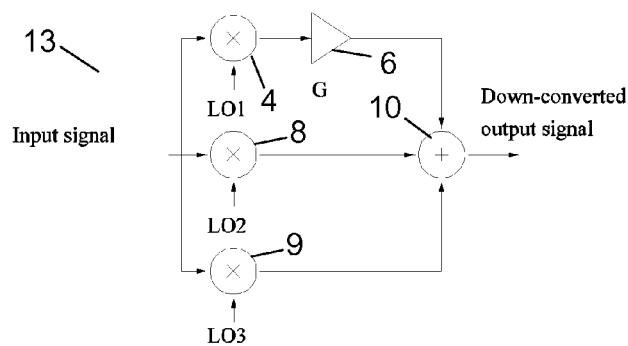
FIG. 10 shows a corresponding mixing circuit.

In a practical implementation, the generation of the second local oscillator signal LO2 and the mixing of this signal with the input signal may be done by generating two separate square waves, i.e. one corresponding to the positive part of the LO2 signal and one corresponding to the negative part, and then mixing each one with the input signal separately before adding the mixing results with the mixing result from LO1. This is illustrated in FIG. 9, which corresponds to FIG. 6, except for the fact that the LO2 signal is split up into the two separate square waves. Thus in this case all three square waves have a duty cycle of 1/3. Instead of having one of the square waves with negative amplitude, it is also possible to use positive amplitude also for this signal and then subtract its mixing result from the others instead of adding them, or one could invert the input to one mixer. A natural way of doing this using a differential design is to flip the inputs and thereby invert the signal at the input. A corresponding mixing circuit 13 is shown in FIG. 10. The multiplier 4 and the amplifier 6 are the same as in FIG. 6, while the multipliers 8 and 9 are used for mixing the input signal with the two separate square waves replacing the combined LO2 signal. The mixing results are added in the adder 10.

Regarding advantages of the idea described above, it is noted that in order to use an IF receiver architecture with a switching mixer, it is necessary to address the problem of harmonic down-conversion. This disclosure proposes a method, which is easy to implement, to take care of this by suppressing the effect of harmonic down-conversion. Being able to use rail-to-rail square wave LO and switching mixers, instead of relying on sinusoidal LO generation and analog multipliers as mixers, is a big advantage from an implementation point of view. By using the proposed method all odd harmonics up to and including the ninth order are suppressed. Third and ninth are suppressed by the chosen duty cycle, while fifth and seventh are suppressed using the method shown in FIG. 4 where two mixers are used together with a gain stage where the fundamental content is added in phase and the fifth and seventh order content is cancelled due to the 180 degree phase difference. This idea utilizes a minimum of hardware to suppress all odd harmonics within a decade from the fundamental frequency. In a practical implementation, matching will determine the achievable harmonic rejection.

Although various embodiments of the present invention have been described and shown, the invention is not restricted thereto, but may also be embodied in other ways within the scope of the subject-matter defined in the following claims.

The invention claimed is:

1. A method of frequency down-converting an input signal having a first frequency to an output signal having a second frequency, comprising:
   generating a first local oscillator signal as a square wave having:
      a cycle period corresponding to the sum of or the difference between the first and second frequencies; and
      a duty cycle of 1/3 or 2/3;
      a consistent polarity in the fraction of the cycle period where it is active;
   generating a second local oscillator signal as a modified square wave having:
      a cycle period the same as the first local oscillator signal; and
      a duty cycle of 2/3, of which 1/3 of the cycle period has a positive amplitude and another 1/3 of the cycle period has a negative amplitude;
   wherein the first and second local oscillator signals are generated such that they have a phase shift of $\pi/2$ between them, such that the first local oscillator signal has a delay of 1/4 of the cycle period compared to the second local oscillator signal;
   mixing the input signal with the first local oscillator signal to form a first down-converted signal;
   mixing the input signal with the second local oscillator signal to form a second down-converted signal;
   multiplying at least one of the down-converted signals by a pre-calculated factor; and
   adding the two resulting down-converted signals to form the output signal.

2. The method of claim 1 wherein the multiplying comprises multiplying the first down-converted signal by a factor of $\sqrt{3}$.

3. The method of claim 1 wherein the multiplying comprises multiplying the second down-converted signal by a factor of $1/\sqrt{3}$.

4. The method according to claim 1:
   wherein the generating the second local oscillator signal comprises generating two separate component square wave signals having respectively a first and a second polarity;
   wherein the mixing the input signal with the second local oscillator signal comprises mixing the input signal with each one of the component square wave signals.

5. A mixing circuit for frequency down-converting an input signal having a first frequency to an output signal having a second frequency, the mixing circuit comprising:
   a first oscillator configured to generate a first local oscillator signal as a square wave having:
      a cycle period corresponding to the sum of or the difference between the first and second frequencies; and
      a duty cycle of 1/3 or 2/3;
      a consistent polarity in the fraction of the cycle period where it is active;
   a first mixer configured to mix the input signal with the first local oscillator signal to form a first down-converted signal;
   an second oscillator configured to generate a second local oscillator signal as a modified square wave having:
      a cycle period the same as the first local oscillator signal; and
      a duty cycle of 2/3, of which 1/3 of the cycle period has a positive amplitude and another 1/3 of the cycle time has a negative amplitude;
   wherein the mixing circuit is configured to generate the first and second local oscillator signals with a phase shift of $\pi/2$ between them, such that the first local oscillator signal has a delay of 1/4 of the cycle period compared to the second local oscillator signal;
   a second mixer configured to mix the input signal with the second local oscillator signal to form a second down-converted signal;
   an amplifier configured to multiply at least one of the down-converted signals by a pre-calculated factor; and
   an adder configured to add the two resulting down-converted signals to form the output signal.

6. The mixing circuit of claim 5 wherein the amplifier is configured to multiply the first down-converted signal by a factor of $\sqrt{3}$.

7. The mixing circuit of claim 5 wherein the amplifier is configured to multiply the second down-converted signal by a factor of $1/\sqrt{3}$.

8. The mixing circuit of claim 5:
   wherein the second oscillator is configured to generate two separate component square wave signals having respectively a first and a second polarity;
   wherein the second mixer is configured to mix the input signal with each one of the component square wave signals.

* * * * *

UNITED STATES PATENT AND TRADEMARK OFFICE
CERTIFICATE OF CORRECTION

| | | |
|---|---|---|
| PATENT NO. | : 8,665,000 B2 | Page 1 of 1 |
| APPLICATION NO. | : 13/576827 | |
| DATED | : March 4, 2014 | |
| INVENTOR(S) | : Andersson et al. | |

It is certified that error appears in the above-identified patent and that said Letters Patent is hereby corrected as shown below:

In the Specification:

In Column 3, Line 23, delete "cycle a;" and insert -- cycle α; --, therefor.

In Column 3, Line 24, delete "cycle a" and insert -- cycle α --, therefor.

Signed and Sealed this
Fifteenth Day of July, 2014

Michelle K. Lee
*Deputy Director of the United States Patent and Trademark Office*